(12) United States Patent
Uwada et al.

(10) Patent No.: US 6,978,079 B2
(45) Date of Patent: Dec. 20, 2005

(54) OPTICAL SEMICONDUCTOR DEVICE

(75) Inventors: Kazuki Uwada, Osaka (JP); Yuji Hotta, Osaka (JP); Noriaki Harada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/119,741

(22) Filed: May 3, 2005

(65) Prior Publication Data

US 2005/0249480 A1    Nov. 10, 2005

(30) Foreign Application Priority Data

May 10, 2004  (JP)  .......................... P.2004-140229

(51) Int. Cl.[7] ............................................. H01L 23/29
(52) U.S. Cl. ..................... 385/147; 385/94; 385/141; 257/789; 257/790
(58) Field of Search ........................... 385/88–94, 141, 385/147; 257/787–790, 792

(56) References Cited

U.S. PATENT DOCUMENTS

2003/0159773 A1 * 8/2003 Tomiyama et al. ......... 156/248
2005/0008873 A1 * 1/2005 Noro et al. ............... 428/423.1

FOREIGN PATENT DOCUMENTS

JP            2003-179267 A     6/2003

* cited by examiner

*Primary Examiner*—John D. Lee
(74) *Attorney, Agent, or Firm*—Sughrue Mion, PLLC

(57) ABSTRACT

The present invention provides an optical semiconductor device comprising: a wiring circuit board; at least one optical semiconductor element mounted on the wiring circuit board; resin layer A that encapsulates the at least one optical semiconductor element therewith; and resin layer B interposed between the resin layer A and the wiring circuit board, and having a tensile modulus as measured at 30° C. of 0.001 to 0.4 GPa.

7 Claims, 1 Drawing Sheet

US 6,978,079 B2

OPTICAL SEMICONDUCTOR DEVICE

FIELD OF THE INVENTION

The present invention relates to an optical semiconductor device for use in the backlights of liquid-crystal displays and in light-emitting displays, etc.

BACKGROUND OF THE INVENTION

In optical semiconductor devices heretofore in use, the optical semiconductor elements are encapsulated in a transparent thermosetting synthetic resin such as, e.g., an epoxy resin so as to prevent deterioration. However, there has been a problem that these synthetic resins upon curing impose a stress on the optical semiconductor elements to cause deterioration.

For preventing such stress imposed on optical semiconductor elements, an optical semiconductor device has been reported which includes an optical semiconductor element directly sealed with a thermosetting synthetic resin reduced in stress imposition and further with a transparent thermosetting synthetic resin (see, for example, patent document 1).

Patent Document 1: JP 2003-179267 A.

However, the optical semiconductor device described above is ineffective in relieving the stress caused by a difference in the coefficient of linear expansion between the encapsulating resins and the wiring circuit board, although the stress to be imposed on the optical semiconductor element may be relieved. There are hence cases where this optical semiconductor device warps. Warpage not only causes the optical semiconductor device to have a shape failure but also results in cases where the quantity of light emitted from the light emission-side face becomes uneven. Such problems are important especially for the backlights of liquid-crystal displays in which a reduction in thickness is desired.

SUMMARY OF THE INVENTION

Accordingly, an object of the invention is to provide an optical semiconductor device in which warpage caused by a stress between an encapsulating resin and a wiring circuit board has been reduced and the quantity of light emitted is even throughout the light-emission face.

Other objects and effects of the invention will become apparent from the following description.

Specifically, the invention relates to:

(1) An optical semiconductor device comprising:
a wiring circuit board;
at least one optical semiconductor element mounted on the wiring circuit board;
resin layer A that encapsulates the at least one optical semiconductor element therewith;
resin layer B, interposed between the resin layer A and the wiring circuit board, and having a tensile modulus as measured at 30° C. of 0.001 to 0.4 GPa; and (2) The optical semiconductor device as described in (1) above, wherein an upper face of the at least one optical semiconductor element is at least partly in contact with the resin layer A.

According to the invention, an optical semiconductor device can be provided in which the warpage caused by a stress between an encapsulating resin and a wiring circuit board has been reduced and the quantity of light emitted is even throughout the light-emission face.

Figure 1:
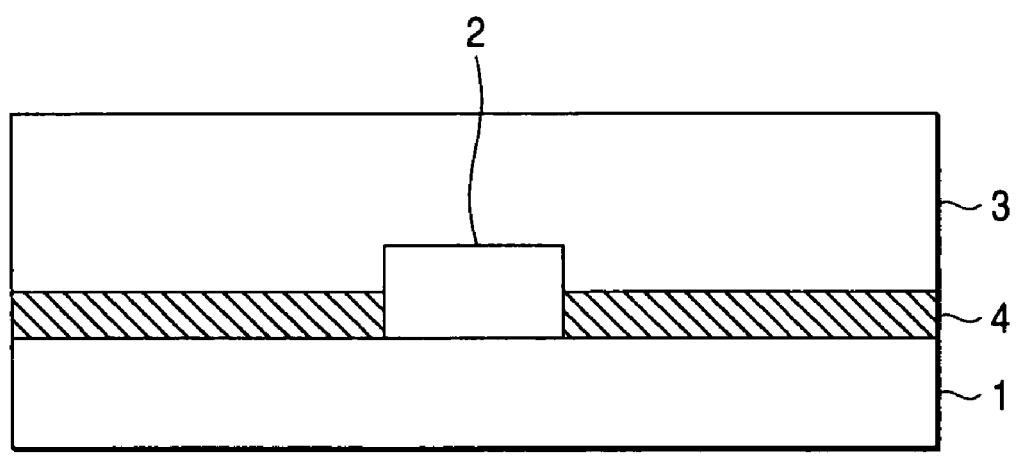
FIG. 1 illustrates one embodiment of the optical semiconductor device of the invention.

The reference numerals used in the drawing denote the followings, respectively.
1: Wiring circuit board
2: Optical semiconductor element
3: Layer A
4: Layer B

DETAILED DESCRIPTION OF THE INVENTION

The optical semiconductor device of the invention comprises a wiring circuit board and an optical semiconductor element mounted thereon and encapsulated with a resin, and one major feature thereof resides in that the device has a resin layer having a tensile modulus as measured at 30° C. of 0.001 to 0.4 GPa (hereinafter sometimes referred to simply as "layer B") disposed between the encapsulating resin layer (hereinafter sometimes referred to simply as "layer A") and the wiring circuit board. The layer B in the invention functions as a stress-relieving resin layer capable of efficiently relieving a stress between the layer A and the wiring circuit board. The disposition of this layer B can reduce the warpage of the optical semiconductor device and make the quantity of light even throughout the light emission face.

One embodiment of the optical semiconductor device of the invention is shown in FIG. 1.

The optical semiconductor device shown in FIG. 1 comprises a wiring circuit board 1 and an optical semiconductor element 2 mounted thereon, and this optical semiconductor element 2 is encapsulated with a layer 3 (layer A). Furthermore, a layer 4 (layer B) is disposed between the layer 3 (layer A) and the wiring circuit board 1.

Examples of the substrate of the wiring circuit board 1 to be used in the invention include glass-epoxy substrates, polyimide substrates, and epoxy resin substrates. From the standpoint of attaining enhanced light reflection, a white wiring circuit board filled with a filler such as titanium oxide is preferred. Furthermore, a reflecting layer such as, e.g., a layer of a thermosetting resin or photocured resin which contains a filler such as titanium oxide, zirconium oxide, or silicon oxide dispersed therein or a vacuum-deposited metal layer may be formed on the surface of the wiring circuit board in order to further enhance light reflection. The tensile modulus at 30° C. of the wiring circuit board is not particularly limited, but preferably is 1 to 30 GPa. The coefficient of linear expansion thereof also is not particularly limited, but preferably is $5.0 \times 10^{-6}$ to $6.0 \times 10^{-5}$. The thickness of the wiring circuit board is preferably 10 to 1,000 $\mu$m. Tensile modulus in the invention can be measured, for example, with a dynamic viscoelastometer (DMS210, manufactured by Seiko Instrument Inc.) at 30° C.

Examples of the optical semiconductor element 2 to be used in the invention include face-up type optical semiconductor elements, which have electrodes on the light emission-side face, and flip chip type optical semiconductor elements, which are directly mounted on wiring circuit boards. Such optical semiconductor element to be used may be, for example, a commercial one or one produced by a method known in this field.

Examples of methods for mounting an optical semiconductor element on a wiring circuit board include the face-up bonding method, which is suitable for mounting optical semiconductor elements having electrons disposed on the light emission-side face, and the flip chip bonding method, which is suitable for mounting optical semiconductor elements having electrodes disposed on the side opposite to the light emission-side face. In mounting optical semiconductor elements on a wiring circuit board, monochromatic optical semiconductor elements only may be mounted. Alternatively, red, green, and blue optical semiconductor elements may be mounted in suitable arrangement in order to obtain white light.

The material for the resin layer 4 (layer B) to be used in the invention is not particularly limited as long as the tensile modulus at 30° C. of the layer B formed is within that range. Examples of the material include ethylene/ethyl acrylate copolymers (e.g., Evaflex EEA A-709 (manufactured by Du Pont-Mitsui Polychemicals Co., Ltd.)), hydrogenated thermoplastic styrene elastomers (e.g., Tuftec M1913 and M1943 (manufactured by Asahi Chemical Industry Co., Ltd.)), and polycarbodiimide resins. From the standpoint of heat resistance, polycarbodiimide resins are preferred of these. These resins may be used singly or in combination of two or more thereof.

Examples of the polycarbodiimide resins usable as materials for the layer B include a polycarbodiimide comprising:

$n_1$ pieces of structural units represented by general formula I:

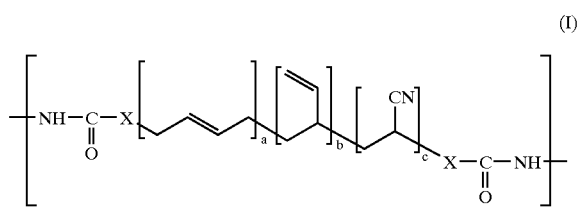

(I)

wherein a, b and c each are an integer of 0 to 200, provided that at least one of a, b and c is not 0; and X represents a single bond or an alkylene group having 1 to 5 carbon atoms;

$n_2$ pieces of structural units represented by general formula II:

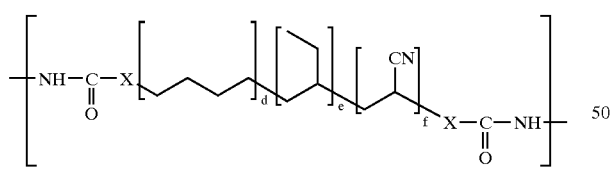

(II)

wherein d, e and f each are an integer of 0 to 200, provided that at least one of d, e and f is not 0; and X represents a single bond or an alkylene group having 1 to 5 carbon atoms; and $n_3$ pieces of structural units represented by general formula III:

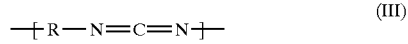

(III)

wherein R represents a bivalent organic group having 4 to 40 carbon atoms, and having terminal structural units obtained by reacting each end of the molecules with a monoisocyanate, wherein $n_1+n_2$ is an integer of 2 or larger, $n_3$ is an integer of 1 or larger, $n_1+n_2+n_3$ is from 3 to 1,500, and $(n_1+n_2)/(n_1+n_2+n_3)$ is from 1/8 to 1/3.

From the standpoint of regulating the tensile modulus so as to be within the range shown above, the values of a, b, and c each are preferably 0 to 150, more preferably 0 to 100. From the standpoint of regulating the tensile modulus so as to be within the range shown above, the values of d, e, and f each are preferably 0 to 150, more preferably 0 to 100.

X represents a single bond or an alkylene group having 1 to 5 carbon atoms. Examples of the alkylene group having 1 to 5 carbon atoms include ethylene and propylene.

R represents a bivalent organic group having 4 to 40 carbon atoms, such as, e.g., an alkylene or arylene group having 4 to 40 carbon atoms. Examples of the alkylene group having 4 to 40 carbon atoms include a hexamethylene group, a 4,4'-dicyclohexylmethane diisocyanate residue group, and an isophorone diisocyanate residue group. Examples of the arylene group having 4 to 40 carbon atoms include tolylene and a 4,4'-diphenylmethane diisocyanate residue group.

From the standpoint of regulating the tensile modulus so as to be within the range shown above, $n_1+n_2$ is preferably an integer of 2 to 1,000, more preferably an integer of 2 to 100, especially preferably an integer of 2 to 10; $n_3$ is preferably an integer of 1 to 500, more preferably an integer of 1 to 300, especially preferably an integer of 1 to 10; $n_1+n_2+n_3$ is preferably an integer of 3 to 70, more preferably an integer of 3 to 20; and $(n_1+n_2)/(n_1+n_2+n_3)$ is preferably from 1/7 to 1/3.

Examples of the terminal structural unit obtained by the reaction with a monoisocyanate include substituted or unsubstituted, aryl or alkyl groups. Examples of the substituted aryl groups include tolyl, isopropylphenyl, methoxyphenyl, and chlorophenyl. Examples of the unsubstituted aryl groups include phenyl and naphthyl. Examples of the substituted alkyl groups include 2,2,4-trimethylhexyl. Examples of the unsubstituted alkyl groups include alkyl groups having 1 to 10 carbon atoms, such as n-butyl, n-hexyl, and n-octyl.

In the invention, the polycarbodiimide can be obtained by subjecting a bifunctional liquid rubber represented by general formula I':

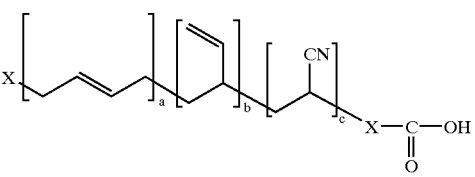

(I')

wherein a, b and c each are an integer of 0 to 200, provided that at least one of a, b and c is not 0; and X represents a single bond or an alkylene group having 1 to 5 carbon atoms)

and/or a bifunctional liquid rubber represented by general formula II':

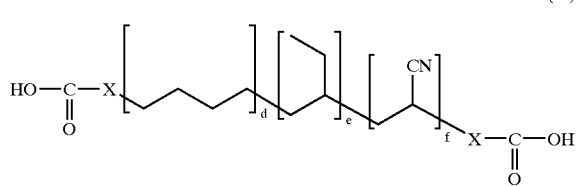

(II')

wherein d, e and f each are an integer of 0 to 200, provided that at least one of d, e and f is not 0; and X represents a single bond or an alkylene group having 1 to 5 carbon atoms)

(hereinafter these rubbers are sometimes referred to simply as "bifunctional liquid rubbers") to a condensation reaction with one or more diisocyanates and then blocking each end of the condensate with a monoisocyanate.

Examples of the bifunctional liquid rubber represented by general formula I' include liquid polybutadienes (e.g., Hycar CTB (trademark), manufactured by Ube Industries, Ltd., and C-1000, manufactured by Nippon Soda Co., Ltd.) and liquid polybutadiene/acrylonitrile copolymers (e.g., Hycar CTBN (trademark), manufactured by Ube Industries, Ltd.). Examples of the bifunctional liquid rubber represented by general formula II' include liquid hydrogenated polybutadienes (e.g., CI-1000, manufactured by Nippon Soda Co., Ltd.). These bifunctional liquid rubbers may be used singly or in combination of two or more thereof.

Examples of the diisocyanates to be used as a starting material include aromatic diisocyanates and aliphatic diisocyanates. These may be used singly or in combination of two or more thereof.

Examples of the aromatic diisocyanates include 2,4-tolylene diisocyanate, 2,6-tolylene diisocyanate, 6-methoxy-2,4-phenylene diisocyanate, 5-bromo-2,4-tolylene diisocyanate, 4,4'-diphenylmethane diisocyanate, 3,3',5,5'-tetraethyl-4,4'-diphenylmethane diisocyanate, 4,4'-diphenylisopropylidene diisocyanate, 4,4'-diphenyl ether diisocyanate, 4,4'-diphenyl sulfide diisocyanate, 4,4'-diphenyl sulfoxide diisocyanate, 3,3',5,5'-tetramethyl-4,4'-biphenyl diisocyanate, 3,3'-dimethoxy-4,4'-biphenyl diisocyanate, and 3,3'-dibromo-4,4'-biphenyl diisocyanate.

Examples of the aliphatic diisocyanates include 4,4'-dicyclohexylmethane diisocyanate, norbornane diisocyanate, 4,4'-cyclohexane diisocyanate, isophorone diisocyanate, methylcyclohexane 2,4-diisocyanate, 2,4-bis(isocyanatomethyl)cyclohexane, hexamethylene diisocyanate, 2,2,4-trimethylhexamethylene diisocyanate, octamethylene diisocyanate, dodecamethylene diisocyanate, xylylene diisocyanate, α,α,α',α'-tetramethylxylylene diisocyanate, and 4-isocyanatomethylphenyl isocyanate.

The bifunctional liquid rubbers respectively represented by general formulae I' and II' are used in such molar amounts that the requirements concerning the values of $n_1$ and $n_2$ are satisfied. In the case where the two rubbers are used in combination, the molar ratio between these, that is, the ratio of $n_1$ to $n_2$ (i.e., $n_1/n_2$), is not particularly limited. The molar ratio of these bifunctional liquid rubbers to the diisocyanates (bifunctional liquid rubbers/diisocyanates) is preferably from 1/7 to 1/2, more preferably from 1/5 to 1/2.

In the case where an aromatic diisocyanate and an aliphatic diisocyanate are used in combination as the diisocyanates, the molar ratio of the aromatic diisocyanate to the aliphatic diisocyanate (aromatic diisocyanate/aliphatic diisocyanate) is preferably from 3/2 to 99/1, more preferably from 4/1 to 99/1.

Examples of the monoisocyanate to be used as a starting material include isocyanates having a substituted or unsubstituted aryl group, such as phenyl isocyanate, naphthyl isocyanate, tolyl isocyanate, p-isopropylphenyl isocyanate, methoxyphenyl isocyanate, and chlorophenyl isocyanate; and alkyl isocyanates in which the alkyl has 1 to 10 carbon atoms, such as n-butyl isocyanate, n-hexyl isocyanate, and n-octyl isocyanate. These may be used singly or in combination of two or more thereof.

It is preferred that the monoisocyanate be used in an amount of 1 to 40 mol per 100 mol of the diisocyanate ingredient used. Monoisocyanate ingredient amounts not smaller than 1 mol per 100 mol of the diisocyanate ingredient are preferred because the polycarbodiimide obtained neither has too high a molecular weight nor undergoes a crosslinking reaction and, for example, the polycarbodiimide solution obtained undergoes neither an increase in viscosity nor solidification nor a decrease in storage stability. Monoisocyanate ingredient amounts not larger than 40 mol per 100 mol of the diisocyanate ingredient are preferred because the polycarbodiimide solution has an appropriate viscosity and, for example, applying and drying this solution in film formation satisfactorily gives a film. The polycarbodiimide solution obtained through terminal blocking with a monoisocyanate used in an amount within that range relative to the diisocyanate ingredient has highly excellent storage stability.

By using the ingredients in the proportion described above, a polycarbodiimide with $n_1$, $n_2$, and $n_3$ satisfying the above-described ranges can be obtained.

Specifically, the polycarbodiimide can be produced by reacting starting materials comprising the bifunctional liquid rubber and a diisocyanate in an aprotic solvent, subsequently conducting a condensation reaction to form a carbodiimide in the presence of a catalyst for carbodiimide formation, and blocking the terminals of the carbodiimide with a monoisocyanate.

The polycarbodiimide production described above is preferably conducted, for example, in the following manner. Seventy parts by weight of the bifunctional liquid rubber is mixed with 30 parts by weight of tolylene diisocyanate in toluene solvent. This mixture is stirred at 50° C. for 1 hour. Thereafter, 1-naphthyl isocyanate is mixed therewith in an amount of 2 mol per 100 mol of the tolylene diisocyanate, and a catalyst for carbodiimide formation is added to the mixture. The temperature of the resultant mixture is elevated to 100° C. and a carbodiimide-forming reaction is conducted at this temperature for about 2 hours to produce the target polymer. With respect to the time period of the carbodiimide-forming reaction, the end point of this reaction can be determined, for example, by the method which will be described later.

The temperature for the reaction between the bifunctional liquid rubber and the diisocyanate is preferably 10 to 50° C., more preferably 30 to 50° C., from the standpoints of reducing the reaction time and preventing the thermal deterioration of the liquid rubber. The reaction time may be about from 30 minutes to 2 hours, and is generally about 1 hour. The end point of the reaction is ascertained based on disappearance of the absorption attributable to the stretching vibration of OH (3,000 cm$^{-1}$) in the terminal carboxyl groups of the bifunctional liquid rubber.

The temperature for the carbodiimide-forming reaction is preferably 10 to 150° C., more preferably 40 to 110° C.

Temperatures for the carbodiimide-forming reaction not lower than 10° C. are preferred because the reaction does not necessitate too long a time and the resultant polycarbodiimide solution does not contain isocyanate functional groups remaining therein. This polycarbodiimide solution, for example, has improved storage stability. On the other hand, reaction temperatures not higher than 150° C. are preferred because the reaction does not proceed too rapidly and the reaction mixture does not gel due to side reactions. The resultant polycarbodiimide solution, for example, has improved storage stability.

Examples of the catalyst for carbodiimide formation include 3-methyl-1-phenyl-2-phospholene 1-oxide, 1-phenyl-2-phospholene 1-oxide, 1-phenyl-2-phospholene 1-sulfide, 1-ethyl-3-methyl-2-phospholene 1-oxide, 3-methyl-1-phenyl-1-phospha-3-cyclopentene 1-oxide, 2,5-dihydro-3-methyl-1-phenylphospholene 1-oxide, and the 3-phospholene isomers of these phospholene compounds. Furthermore, phosphine oxides such as triphenylphosphine oxide, tritolylphosphine oxide, and bis(oxadiphenylphosphino)ethane can be used. These compounds may be used singly or in combination of two or more thereof.

The amount of the catalyst for carbodiimide formation to be used is preferably in the range of from 0.001 to 5 mol per 100 mol of all isocyanate ingredient used. Amounts thereof not less than 0.001 mol are preferred because the reaction does not necessitate too long a time. Amounts thereof not larger than 5 mol are preferred because the gelation attributable to too rapid progress of the reaction does not occur and the resultant polycarbodiimide solution, for example, has improved storage stability.

The terminal blocking with a monoisocyanate can be accomplished by adding the monoisocyanate to the reaction mixture in an initial, middle, or final stage of the carbodiimide formation or throughout the carbodiimide formation.

Examples of the aprotic solvent to be used in the polycarbodiimide production include toluene, xylene, alkyltoluenes in which the alkyl has 3 to 5 carbon atoms, benzene, alkylbenzenes in which the alkyl has 3 to 6 carbon atoms, naphthalene, tetrahydrofuran, dioxane, acetone, butanone, cyclohexanone, N-methylpyrrolidone, N,N-dimethylformamide, and N,N-dimethylacetamide. These may be used singly or in combination of two or more thereof.

It is preferred that the aprotic solvent be used in such an amount as to result in a polycarbodiimide solution having a polycarbodiimide concentration in the range of 1 to 90% by weight. Polycarbodiimide concentrations not lower than 1% by weight are preferred because solvent removal in molding the polycarbodiimide obtained is easy. Polycarbodiimide concentrations not higher than 90% by weight are preferred because the polycarbodiimide solution has an appropriate viscosity and improved storage stability.

The end point of the carbodiimide-forming reaction can be ascertained by infrared spectroscopy (IR analysis) from the occurrence of the absorption attributable to the stretching vibration of the atomic group N=C=N (2,135 $cm^{-1}$) in the polycarbodiimide yielded, disappearance of the absorption attributable to the stretching vibration of the atomic group N=C=O (2,270 $cm^{-1}$) in the isocyanates, and observation of the absorption attributable to the stretching vibration of the C=O (1,695 $cm^{-1}$) in the amide group in each linkage between the bifunctional liquid rubber and the diisocyanate.

After completion of the carbodiimide-forming reaction, a polycarbodiimide is obtained usually as a solution. However, the solution obtained may be poured into a poor solvent such as methanol, ethanol, isopropyl alcohol, or hexane to precipitate the polycarbodiimide and remove the unreacted monomers and the catalyst.

In preparing a solution of the polycarbodiimide which has been thus recovered as a precipitate, this precipitate is washed and dried in a given manner and then dissolved again in an aprotic solvent. By performing this operation, the polycarbodiimide solution can have improved storage stability.

In the case where by-products are contained in the polycarbodiimide solution, this solution may be purified, for example, by adsorptively removing the by-products with an appropriate adsorbent. Examples of the adsorbent include alumina gel, silica gel, activated carbon, zeolites, activated magnesium oxide, activated bauxite, Fuller's earth, activated clay, and molecular-sieve carbon. These may be used singly or in combination of two or more thereof.

The layer B is obtained, for example, in the following manner. The resin is dissolved in an organic solvent, such as toluene, cyclohexanone, or methyl ethyl ketone, so as to result in a concentration of preferably 20 to 50% by weight to prepare a resin solution. This solution is formed into a film having an appropriate thickness, for example, on a release sheet having a silicone-treated surface by a technique such as casting, spin coating, or roll coating. This film is dried at such a temperature that the solvent can be removed without causing a curing reaction to proceed, whereby the resin layer B is formed. The temperature at which the resin solution which has been formed into a film is dried cannot be unconditionally determined because it varies depending on the kinds of the resin and solvent. However, the temperature is preferably 20 to 180° C., more preferably 50 to 150° C., even more preferably 70 to 120° C. The thickness of the resin layer obtained through drying with heating is preferably 5 to 20 µm, more preferably 5 to 10 µm. The tensile modulus at 30° C. of the layer B obtained is 0.001 to 0.4 GPa, preferably 0.001 to 0.1 GPa, more preferably 0.001 to 0.05 GPa.

From the standpoint of securing a sufficient efficiency of light takeout, the layer B preferably is not in contact with the upper face of the optical semiconductor element. The term "upper face" herein means a light emission-observing face (i.e., top surface) of the optical semiconductor element. The term "not in contact with the upper face" means a state other than the state in which the whole upper face of the optical semiconductor element is in direct contact with the layer B. Namely, the upper face of the element may be partly in contact with the layer B as long as not all the upper face is in contact with the layer B. In order for the layer B not to be in contact with the upper face of the optical semiconductor element, the layer B preferably has been disposed around the side faces of the optical semiconductor element as shown in FIG. 1. The side faces of the optical semiconductor element may be either in contact with the layer B or not in contact with the layer B. In the latter case, the layer A may be formed such that it is partly interposed into the space between the side faces of the optical semiconductor element and the layer B to fill the space.

Methods for superposing layer B on the wiring circuit board are not particularly limited. For example, the superposition can be accomplished by laminating the layer B obtained above to the wiring circuit board and then removing the release sheet. One or more layers B may be further superposed on that layer B which has been superposed. In this case, it is preferred that these layers B be disposed in the order that their tensile modulus at 30° C. are increasing, layer by layer, from the wiring circuit board side toward the layer A.

Examples of the material for the encapsulating resin layer 3 (layer A) with which the optical semiconductor element 2 is encapsulated include epoxy resins, acrylic resins, urethane resins, and polycarbodiimide resins. These may be used singly or in combination of two or more thereof. These resin layers may contain a white fluorescent agent so as to enable the optical semiconductor device to emit white light.

Examples of methods for encapsulating the optical semiconductor element 2 with a single resin layer A include: transfer molding or casting in which a resin solution prepared by dissolving any of those resins in an organic solvent such as toluene, cyclohexanone, or methyl ethyl ketone is used; and a laminating method in which a resin which has been formed into a sheet beforehand as in the case of the layer B is pressed with heating. Preferred of these is the laminating method because this method enables low-cost easy molding.

Examples of methods for encapsulation with two or more resin layers A include: methods in which the individual layers are successively disposed by transfer molding, casting, or a laminating technique in which each resin layer which has been formed into a sheet is pressed with heating; and a laminating method in which a sheet made up of two or more resin layers is formed beforehand and then pressed with heating. In the case where the layer A is constituted of two or more resin layers, it is preferred, from the standpoint of improving the efficiency of light takeout, that the layer A should be constituted of two or more resin layers differing in refractive index. More preferably, the layer A is constituted of two or more resin layers which have been disposed in the order that their refractive index is decreasing, layer by layer, from the optical semiconductor element side toward the outermost layer.

The thickness of the layer A obtained or the overall thickness of the layer A in the case where it is constituted of two or more layers is preferably 100 to 500 $\mu$m, more preferably 100 to 300 $\mu$m. The tensile modulus of the layer A as measured at 30° C. cannot be unconditionally specified because it depends on the kind and amount of the material used, etc. However, the tensile modulus thereof is preferably 1 to 5 GPa. The coefficient of linear expansion thereof also cannot be unconditionally specified because it depends on the kind and amount of the material used, etc. However, the coefficient of linear expansion of the layer A is preferably $5.0 \times 10^{-5}$ to $1.0 \times 10^{-4}$.

The optical semiconductor device of the invention can be obtained in the manner described above. The total thickness of the layer A and layer B is preferably 520 $\mu$m or smaller, more preferably 320 $\mu$m or smaller.

The layer A and layer B which are used in the invention considerably differ from each other in tensile modulus at 30° C. as stated above. The layers A and B can be easily distinguished by measuring the tensile modulus of each layer.

EXAMPLES

The present invention will be illustrated in greater detail with reference to the following Examples, but the invention should not be construed as being limited thereto.

Production Example 1

Production of Film for Layer A

A solution prepared by dissolving epoxy resin tablets for optical-semiconductor element encapsulation (NT-300S, manufactured by Nitto Denko Corp.) in methyl ethyl ketone in a concentration of 30 wt % was applied to a separator (manufactured by Mitsubishi Polyester Film Corp.; thickness, 50 $\mu$m) comprising a poly(ethylene terephthalate) film whose surface had been treated with a release agent (fluorinated silicone). This coating was heated at 100° C. for 1 minute to obtain a semicured film (thickness, 200 $\mu$m) for layer A formation. The resin film obtained was cured by heating at 175° C. for 5 hours in a precision thermostatic chamber (Safety Fine Oven DH-62Z, manufactured by Yamato Scientific Co., Ltd.). Thereafter, the tensile modulus of the cured film was measured with a dynamic viscoelastometer (DES210, manufactured by Seiko Instrument Inc.) under the conditions of 30° C. and a frequency of 50 Hz. As a result, the tensile modulus thereof was found to be 3.3 GPa.

Production Example 2

Production of Resin Solutions for Producing Film for Layer B

1. Resin Solution A:

An ethylene/ethyl acrylate copolymer (Evaflex EEA A-709, manufactured by Du Pont-Mitsui Polychemicals Co., Ltd.) was dissolved in cyclohexanone in a concentration of 50 wt % to prepare resin solution A.

2. Resin Solution B:

Into a 500-mL four-necked flask equipped with a stirrer, dropping funnel, reflux condenser, and thermometer were introduced 62.81 g (251 mmol) of 4,4'-diphenylmethane diisocyanate, 28.29 g (5.9 mmol) of Hycar CTB2000X162 (manufactured by Ube Industries, Ltd.), 84.87 g (60.6 mmol) of NISSO-PB CI-1000 (manufactured by Nippon Soda Co., Ltd.), and 279.28 g of cyclohexanone. The contents were stirred at 40° C. for 1 hour.

Thereto were added 12.14 g (75.3 mmol) of p-isopropylphenyl isocyanate and 0.48 g (2.51 mmol) of 3-methyl-1-phenyl-2-phospholene 2-oxide. The resultant mixture was heated to 100° C. with stirring and held for further 2 hours.

The progress of reactions was ascertained by IR analysis. Specifically, the decrease in the absorption by the stretching vibration of the atomic group N=C=O (2,270 cm$^{-1}$) in the isocyanates and the increase in the absorption by the stretching vibration of the atomic group N=C=N (2,135 cm$^{-1}$) in the polycarbodiimide were followed. Furthermore, the absorption by the stretching vibration of the C=O (1,695 cm$^{-1}$) in the amide group in each linkage between the bifunctional liquid rubber and the diisocyanate was observed. After the end point of the reactions was ascertained by IR analysis, the reaction mixture was cooled to room temperature. Thus, resin solution B was obtained.

In the polycarbodiimide obtained, $n_1+n_2$ was 9 to 11, $n_3$ was 45 to 55, $n_1+n_2+n_3$ was 54 to 66, and $(n_1+n_2)/(n_1+n_2+n_3)$ was from 9/66 to 11/54.

3. Resin Solution C:

Resin solution C was prepared in the same manner as for resin solution B, except that use was made of 51.3 g (205 mmol) of 4,4'-diphenylmethane diisocyanate, 30.81 g (6.4 mmol) of Hycar CTB2000X162 (manufactured by Ube Industries, Ltd.), 61.61 g (44.0 mmol) of NISSO-PB CI-1000 (manufactured by Nippon Soda Co., Ltd.), 228.1 g of cyclohexanone, 9.91 g (61.5 mmol) of p-isopropylphenyl isocyanate, and 0.39 g (2.05 mmol) of 3-methyl-1-phenyl-2phospholene 2-oxide.

In the polycarbodiimide obtained, $n_1+n_2$ was 7 to 9, $n_3$ was 35 to 45, $n_1+n_2+n_3$ was 42 to 54, and $(n_1+n_2)/(n_1+n_2+n_3)$ was from 7/54 to 9/42.

4. Resin Solution D:

A hydrogenated thermoplastic styrene elastomer (Tuftec M1943, manufactured by Asahi Chemical Industry Co., Ltd.) was dissolved in cyclohexanone in a concentration of 50 wt % to prepare resin solution D.

5. Resin Solution E:

Resin solution E was prepared in the same manner as for resin solution B, except that use was made of 70.57 g (282 mmol) of 4,4'-diphenylmethane diisocyanate, 27.34 g (5.7 mmol) of Hycar CTB2000X162 (manufactured by Ube Industries, Ltd.), 54.68 g (39.1 mmol) of NISSO-PB CI-1000 (manufactured by Nippon Soda Co., Ltd.), 218.51 g of cyclohexanone, 10.91 g (67.68 mmol) of p-isopropylphenyl isocyanate, and 0.54 g (2.82 mmol) of 3-methyl-1-phenyl-2-phospholene 2-oxide.

In the polycarbodiimide obtained, $n_1+n_2$ was 8 to 9, $n_3$ was 45 to 55, $n_1+n_2+n_3$ was 53 to 64, and $(n_1+n_2)/(n_1+n_2+n_3)$ was from 1/8 to 9/53.

6. Resin Solution F:

A hydrogenated thermoplastic styrene elastomer (Tuftec M1913, manufactured by Asahi Chemical Industry Co., Ltd.) was dissolved in cyclohexanone in a concentration of 50 wt % to prepare resin solution F.

7. Resin Solution G:

Into a 500-mL four-necked flask equipped with a stirrer, dropping funnel, reflux condenser, and thermometer were introduced 72.32 g (289 mmol) of 4,4'-diphenylmethane diisocyanate, 28.02 g (8.0 mmol) of Hycar CTBN1300X13 (manufactured by Ube Industries, Ltd.), 56.04 g (40.0 mmol) of NISSO-PB CI-1000 (manufactured by Nippon Soda Co., Ltd.), and 215.79 g of cyclohexanone. The contents were stirred at 40° C. for 1 hour.

Thereto were added 11.18 g (69.36 mmol) of p-isopropylphenyl isocyanate and 0.56 g (2.89 mmol) of 3-methyl-1-phenyl-2-phospholene 2-oxide. The resultant mixture was heated to 100° C. with stirring and held for further 2 hours.

The progress of reactions was ascertained by IR analysis in the same manner as in the preparation of resin solution B, and the reaction mixture was then cooled to room temperature. Thus, resin solution G was obtained.

In the polycarbodiimide obtained, $n_1+n_2$ was 7 to 9, $n_3$ was 35 to 45, $n_1+n_2+n_3$ was 42 to 54, and $(n_1+n_2)/(n_1+n_2+n_3)$ was from 7/54 to 9/42.

8. Resin Solution H:

Into a 500-mL four-necked flask equipped with a stirrer, dropping funnel, reflux condenser, and thermometer were introduced 11.84 g (68 mmol) of TDI (a mixture of 80 mol % 2,4-tolylene diisocyanate and 20 mol % 2,6-tolylene diisocyanate; manufactured by Mitsui-Takeda Chemicals, Inc.), 51.05 g (204 mmol) of 4,4'-diphenylmethane diisocyanate, 24.65 g (7.0 mmol) of Hycar CTBN1300X13 (manufactured by Ube Industries, Ltd.), 49.29 g (35.2 mmol) of NISSO-PB CI-1000 (manufactured by Nippon Soda Co., Ltd.), and 193.36 g of toluene. The contents were stirred at 40° C. for 1 hour.

Thereto were added 10.52 g (65.28 mmol) of p-isopropylphenyl isocyanate and 0.52 g (2.72 mmol) of 3-methyl-1-phenyl-2-phospholene 2-oxide. The resultant mixture was heated to 100° C. with stirring and held for further 2 hours.

The progress of reactions was ascertained by IR analysis in the same manner as in the preparation of resin solution B, and the reaction mixture was then cooled to room temperature. Thus, resin solution H was obtained.

In the polycarbodiimide obtained, $n_1+n_2$ was 8 to 9, $n_3$ was 42 to 52, $n_1+n_2+n_3$ was 50 to 61, and $(n_1+n_2)/(n_1+n_2+n_3)$ was from 8/61 to 9/50.

9. Resin Solution I:

Resin solution I was prepared in the same manner as for resin solution H, except that use was made of 13.93 g (80 mmol) of TDI (a mixture of 80 mol % 2,4-tolylene diisocyanate and 20 mol % 2,6-tolylene diisocyanate; manufactured by Mitsui-Takeda Chemicals, Inc.), 60.06 g (240 mmol) of 4,4'-diphenylmethane diisocyanate, 34.79 g (9.94 mmol) of Hycar CTBN1300X13 (manufactured by Ube Industries, Ltd.), 52.18 g (37.3 mmol) of NISSO-PB CI-1000 (manufactured by Nippon Soda Co., Ltd.), 259.74 g of toluene, 12.38 g (76.8 mmol) of p-isopropylphenyl isocyanate, and 0.62 g (3.2 mmol) of 3-methyl-1-phenyl-2-phospholene 2-oxide.

In the polycarbodiimide obtained, $n_1+n_2$ was 5 to 7, $n_3$ was 55 to 65, $n_1+n_2+n_3$ was 60 to 72, and $(n_1+n_2)/(n_1+n_2+n_3)$ was from 5/72 to 7/60.

10. Resin Solution J:

Into a 500-mL four-necked flask equipped with a stirrer, dropping funnel, reflux condenser, and thermometer were introduced 30.30 g (174 mmol) of TDI (a mixture of 80 mol % 2,4-tolylene diisocyanate and 20 mol % 2,6-tolylene diisocyanate; manufactured by Mitsui-Takeda Chemicals, Inc.), 43.54 g (174 mmol) of 4,4'-diphenylmethane diisocyanate, 14.83 g (4.24 mmol) of Hycar CTBN1300X13 (manufactured by Ube Industries, Ltd.), 29.67 g (21.2 mmol) of NISSO-PB CI-1000 (manufactured by Nippon Soda Co., Ltd.), and 244.5 g of toluene. The contents were stirred at 40° C. for 1 hour.

Thereto were added 7.06 g (41.76 mmol) of 1-naphthyl isocyanate and 0.67 g (3.48 mmol) of 3-methyl-1-phenyl-2-phospholene 2-oxide. The resultant mixture was heated to 100° C. with stirring and held for further 2 hours.

The progress of reactions was ascertained by IR analysis in the same manner as in the preparation of resin solution B, and the reaction mixture was then cooled to room temperature. Thus, resin solution J was obtained.

In the polycarbodiimide obtained, $n_1+n_2$ was 5 to 7, $n_3$ was 60 to 70, $n_1+n_2+n_3$ was 65 to 77, and $(n_1+n_2)/(n_1+n_2+n_3)$ was from 5/77 to 7/65.

11. Resin Solution K:

Resin solution K was prepared in the same manner as for resin solution H, except that use was made of 13.89 g (79.75 mmol) of TDI (a mixture of 80 mol % 2,4-tolylene diisocyanate and 20 mol % 2,6-tolylene diisocyanate; manufactured by Mitsui-Takeda Chemicals, Inc.), 59.87 g (239.25 mmol) of 4,4'-diphenylmethane diisocyanate, 18.58 g (5.31 mmol) of Hycar CTBN1300X13 (manufactured by Ube Industries, Ltd.), 37.16 g (26.5 mmol) of NISSO-PB CI-1000 (manufactured by Nippon Soda Co., Ltd.), 195.67 g of toluene, 9.26 g (57.42 mmol) of p-isopropylphenyl isocyanate, and 0.61 g (3.19 mmol) of 3-methyl-1-phenyl-2-phospholene 2-oxide.

In the polycarbodiimide obtained, $n_1+n_2$ was 5 to 6, $n_3$ was 66 to 76, $n_1+n_2+n_3$ was 71 to 82, and $(n_1+n_2)/(n_1+n_2+n_3)$ was from 5/82 to 6/71.

12. Resin Solution L:

Into a 500-mL four-necked flask equipped with a stirrer, dropping funnel, reflux condenser, and thermometer were introduced 24.42 g (140.2 mmol) of TDI (a mixture of 80 mol % 2,4-tolylene diisocyanate and 20 mol % 2,6-tolylene diisocyanate; manufactured by Mitsui-Takeda Chemicals, Inc.), 84.20 g (336.5 mmol) of 4,4'-diphenylmethane diisocyanate, 47.15 g (224.32 mmol) of naphthalene diisocyanate, and 219.8 g of cyclohexanone. The contents were stirred at 40° C. for 1 hour.

Thereto were added 7.12 g (42.1 mmol) of 1-naphthyl isocyanate and 0.67 g (3.50 mmol) of 3-methyl-1-phenyl-2-phospholene 2-oxide. The resultant mixture was heated to 100° C. with stirring and held for further 2 hours.

The progress of reactions was ascertained by IR analysis in the same manner as in the preparation of resin solution B, and the reaction mixture was then cooled to room temperature. Thus, resin solution L was obtained.

In the polycarbodiimide obtained, $n_1+n_2$ was 0, $n_3$ was 124 to 163, $n_1+n_2+n_3$ was 124 to 163, and $(n_1+n_2)/(n_1+n_2+n_3)$ was 0.

13. Resin Solution M:

Resin solution M was prepared in the same manner as for resin solution L, except that use was made of 24.42 g (140.2 mmol) of TDI (a mixture of 80 mol % 2,4-tolylene diisocyanate and 20 mol % 2,6-tolylene diisocyanate; manufactured by Mitsui-Takeda Chemicals, Inc.), 63.15 g (252.4 mmol) of 4,4'-diphenylmethane diisocyanate, 64.83 g (308.4 mmol) of naphthalene diisocyanate, 223.2 g of cyclohexanone, 7.12 g (42.1 mmol) of 1-naphthyl isocyanate, and 0.67 g (3.50 mmol) of 3-methyl-1-phenyl-2-phospholene 2-oxide.

In the polycarbodiimide obtained, $n_1+n_2$ was 0, $n_3$ was 129 to 158, $n_1+n_2+n_3$ was 129 to 158, and $(n_1+n_2)/(n_1+n_2+n_3)$ was 0.

Production Example 3

Production of Films for Layer B

Resin solutions A to M prepared in Production Example 2 were applied to a separator (manufactured by Mitsubishi Polyester Film Corp.; thickness, 50 μm) comprising a poly(ethylene terephthalate) film whose surface had been treated with a release agent (fluorinated silicone). These coatings were heated at 130° C. for 1 minute and then at 150° C. for 1 minute. Thus, semicured films (a) to (m) (thickness, 10 μm) for layer B formation were obtained.

Production Example 4

Production of Wiring Circuit Board Having Optical Semiconductor Element Mounted

An optical semiconductor element was mounted by wire bonding on a white substrate (CS-3965, manufactured by Risho Kogyo Co., Ltd.; glass-epoxy substrate filled with titanium oxide; 30 mm (length)×30 mm (width)×600 μm (thickness); tensile modulus at 30° C., 23.2 GPa) on which a given wiring pattern had been formed. Thus, a wiring circuit board having an optical semiconductor element mounted thereon was produced.

Test Example 1

Measurement of Tensile Modulus

The resin films obtained in Production Example 3 were cured by heating at 175° C. for 5 hours in a precision thermostatic chamber (Safety Fine Oven DH-62Z, manufactured by Yamato Scientific Co., Ltd.). Thereafter, the tensile modulus of each cured film was measured with a dynamic viscoelastometer (DES210, manufactured by Seiko Instrument Inc.) under the conditions of 30° C. and a frequency of 50 Hz. The results obtained are shown in Table 1.

TABLE 1

| Film for layer B | Resin solution used | Tensile modulus (GPa) |
|---|---|---|
| (a) | A | 0.003 |
| (b) | B | 0.003 |
| (c) | C | 0.005 |
| (d) | D | 0.007 |
| (e) | E | 0.018 |
| (f) | F | 0.020 |
| (g) | G | 0.160 |
| (h) | H | 0.400 |
| (i) | I | 0.560 |
| (j) | J | 0.810 |
| (k) | K | 1.000 |
| (l) | L | 2.330 |
| (m) | M | 2.730 |

Examples 1 to 8 and Comparative Examples 1 to 5

Each of the semicured films for layer B formation obtained in Production Example 3 was laminated to the circuit board obtained in Production Example 4, in such a manner that the film was not in contact with the upper face of the optical semiconductor element. The films used in the respective Examples and Comparative Examples are shown in Table 2. The laminating was conducted with a vacuum laminator (manufactured by Nichigo-Morton Co., Ltd.) at a temperature of 150° C. and a pressure of 0.1 MPa for a period of 60 seconds. Thereafter, the separator was removed to form a layer B on the circuit board. Subsequently, the semicured film for layer A formation produced in Production Example 1 was placed on the layer B and the optical semiconductor element, and heated/pressed with a press plate at 140° C. and 0.1 MPa for 60 seconds. Thereafter, the resins contained in the layer A and layer B were cured by 16-hour heating at 160° C. to thereby form an encapsulating resin layer. Thus, optical semiconductor devices according to the invention and comparative optical semiconductor devices were obtained. In each optical semiconductor device obtained, the thicknesses of the layer A and layer B were 200 μm and 10 μm, respectively.

Test Example 2

Measurement of Semiconductor Device Warpage

The optical semiconductor devices produced in the Examples and Comparative Examples each were placed on a flat plate at room temperature. The warpage heights (i.e., the distances from the surface of the flat plate to the bottom surface of the optical semiconductor device) at the four corners were measured and the average of these was calculated to thereby evaluate the warpage. The results obtained are shown in Table 2.

TABLE 2

| | Layer B used | Warpage (mm) |
|---|---|---|
| Example 1 | a | 0.1 |
| Example 2 | b | 0.1 |
| Example 3 | c | 0.1 |
| Example 4 | d | 0.1 |
| Example 5 | e | 0 |
| Example 6 | f | 0.1 |

TABLE 2-continued

|  | Layer B used | Warpage (mm) |
| --- | --- | --- |
| Example 7 | g | 0.1 |
| Example 8 | h | 0.2 |
| Comparative Example 1 | i | 0.6 |
| Comparative Example 2 | j | 0.8 |
| Comparative Example 3 | k | 0.9 |
| Comparative Example 4 | l | 1.7 |
| Comparative Example 5 | m | 2.1 |

The results given in Tables 1 and 2 show that the optical semiconductor devices in which the layer B has a tensile modulus exceeding 0.4 GPa (Comparative Examples 1 to 5) warp more than the optical semiconductor devices obtained in Examples 1 to 8. It is presumed that these optical semiconductor devices are inferior in the evenness of light emission to the optical semiconductor devices obtained in Examples 1 to 8.

The optical semiconductor device of the invention is suitable for use as, e.g., a surface light source for personal computers, cell phones, etc.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2004-140229 filed May 10, 2004, the contents thereof being herein incorporated by reference.

What is claimed is:

1. An optical semiconductor device comprising:
   a wiring circuit board;
   at least one optical semiconductor element mounted on the wiring circuit board;
   resin layer A that encapsulates the at least one optical semiconductor element therewith; and
   resin layer B interposed between the resin layer A and the wiring circuit board, and having a tensile modulus as measured at 30° C. of 0.001 to 0.4 GPa.

2. The optical semiconductor device of claim 1, wherein an upper face of the at least one optical semiconductor element is at least partly in contact with the resin layer A.

3. The optical semiconductor device of claim 2, wherein the upper face of the at least one optical semiconductor element is fully in contact with the resin layer A.

4. The optical semiconductor device of claim 1, wherein the resin layer B comprises a polycarbodiimide resin.

5. The optical semiconductor device of claim 1, wherein the resin layer B has a thickness of from 5 to 20 μm.

6. The optical semiconductor device of claim 1, wherein the resin layer A has a thickness of from 100 to 500 μM.

7. The optical semiconductor device of claim 1, wherein the resin layer A has a tensile modulus as measured at 30° C. of 1 to 5 GPa.

* * * * *